United States Patent
Godambe et al.

(10) Patent No.: US 7,126,433 B2
(45) Date of Patent: Oct. 24, 2006

(54) SELF-CALIBRATING OSCILLATOR SYSTEM

(75) Inventors: Nihal J. Godambe, Plantation, FL (US); Walter H. Kehler, Sunrise, FL (US)

(73) Assignee: Freescale Semiconductor, Inc., Austin, TX (US)

(*) Notice: Subject to any disclaimer, the term of this patent is extended or adjusted under 35 U.S.C. 154(b) by 82 days.

(21) Appl. No.: 10/802,018

(22) Filed: Mar. 16, 2004

(65) Prior Publication Data

US 2005/0206463 A1    Sep. 22, 2005

(51) Int. Cl.
*H03L 1/00* (2006.01)

(52) U.S. Cl. .................... 331/74; 331/185; 331/186

(58) Field of Classification Search ............... 331/185, 331/186, 74
See application file for complete search history.

(56) References Cited

U.S. PATENT DOCUMENTS

| | | | |
|---|---|---|---|
| 5,126,695 A | * | 6/1992 | Abe ........................ 331/46 |
| 5,534,826 A | | 7/1996 | Logan |
| 6,166,609 A | * | 12/2000 | Nakamiya et al. ......... 331/109 |
| 6,518,846 B1 | | 2/2003 | Ichihara |
| 2003/0060176 A1 | | 3/2003 | Heinonen |

OTHER PUBLICATIONS

Neric H. W. Fong et al, "Design of Wide-Band CMOS VCO for Multiband Wireless LAN Applications," IEEE Journal of Solid-State Circuits, vol. 38, No. 8, pp. 1333-1342.

* cited by examiner

*Primary Examiner*—Joseph Chang

(57) ABSTRACT

A system comprising a voltage controlled oscillator is disclosed. The voltage controlled oscillator includes a single input, a power input, and an oscillation input. The oscillation input is coupled to a amplitude detection device, which in turn provides an indication of an amplitude of the output of the VCO to a threshold detect module. Based upon the threshold detected at the threshold detect module, a threshold indicator is provided to a voltage supply module. The voltage supply powering the voltage controlled oscillator is varied, based upon a value of the threshold indicator.

25 Claims, 3 Drawing Sheets

SELF-CALIBRATING OSCILLATOR SYSTEM

BACKGROUND

1. Field of the Disclosure

The present disclosure is generally related to semiconductor devices and more particularly to signal-controlled oscillators.

2. Description of the Related Art

Radio communication devices, such as cellular telephones, usually include a voltage-controlled oscillator (VCO) as part of their circuitry. To produce the highest quality output signal, noise in the output signal of the VCO should be minimized. However, the reduction of current drain, for example, to extend battery life of a device, generally counteracts efforts to reduce noise at the output of a VCO. In addition, the desirable VCO qualities of guaranteed start-up and wide tuning bandwidth also create design trade-off problems with noise minimization. One method of reducing current drain is for the supply voltage to the VCO to be just large enough to support a specific application. However this practice can prevent the VCO from starting up properly when power is initially applied. A large supply voltage ensures that the oscillator will start in a predictable manner, while too small of a supply voltage may not provide enough energy to cause oscillation to begin. However, large supply voltages consume more power, which requires larger on-chip devices that increase parasitic capacitance and current drain, while reducing the Q and adversely affecting the tuned bandwidth of a system.

Another method of controlling output amplitude, and therefore current drain and noise, of a VCO is to provide a feedback signal that controls and limits the gain of the oscillator. This feedback signal however, is itself a source of additional noise and can require significant overhead to support applications with different output requirements. For example, a transmit VCO for GSM (Global System for Mobile Communications) technology would have a different operating requirement than that for WCDMA (Wideband Code Division Multiple Access).

Therefore, a system and/or method which limits these problems would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

The present disclosure is generally directed towards systems and methods to monitor the output of an oscillator to determine if the oscillator is in a specific operating condition such as a start-up mode. If so, a selection is made within the system to supply a first supply voltage to the oscillator. Otherwise an alternate supply voltage is selected. The present disclosure is better understood with respect to FIGS. 1–6.

Figure 1:
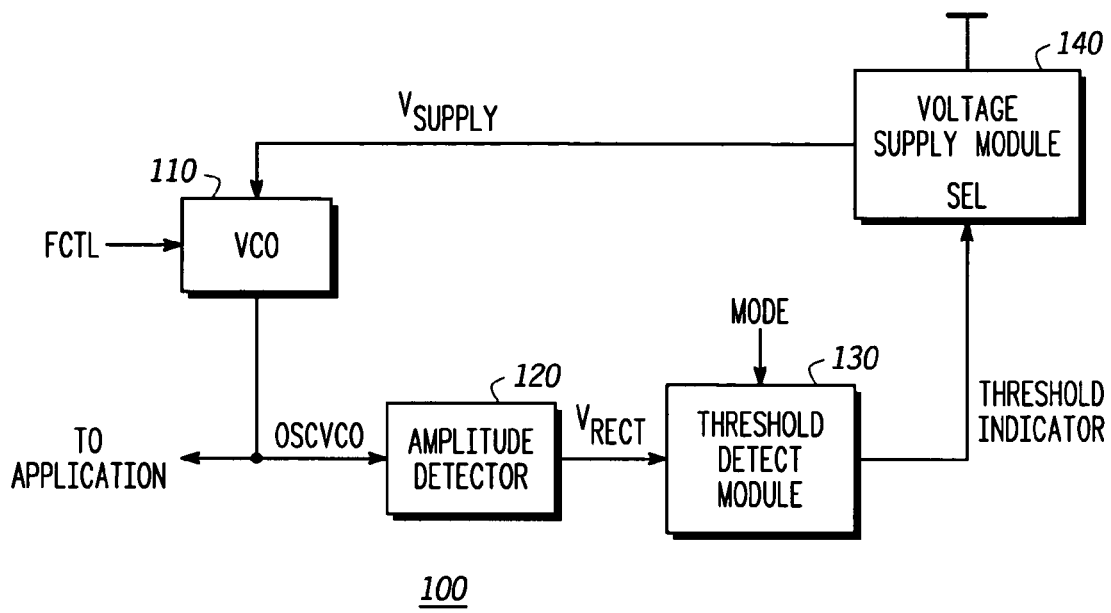
FIG. 1 is a block diagram illustrating a system according to one embodiment of the disclosure.

FIG. 1 illustrates in block diagram form a voltage-controlled oscillator (VCO) module system 100 in accordance with a specific embodiment of the present disclosure. The VCO system 100 includes a VCO 110, an amplitude detector module 120, a threshold detect module 130, and a voltage supply module 140. VCO module 110 has an input to receive a frequency control signal called $F_{CTL}$ and an input to receive a voltage supply called $V_{SUPPLY}$, and an output called OSCVCO. It will be appreciated that a VCO is illustrated as a specific embodiment and that other signal-controlled oscillators, such as a current-controlled oscillator, can be used. The signal OSCVCO is provided as an input to the amplitude detector module 120 and also to other application specific circuitry as indicated. The amplitude detector module 120 processes the OSCVCO signal and provides an output signal called $V_{RECT}$, which quantifies an amplitude of OSCVCO, to a first input of the threshold detect module 130. The threshold detect module 130 has a second input to receive a signal labeled MODE and an output to provide a signal called THRESHOLD INDICATOR. The THRESHOLD INDICATOR signal is provided to an input of the voltage supply module 140. The voltage supply module 140 also has a second input to receive a voltage reference such as $V_{DD}$. The voltage supply module 140 has an output to provide an output called $V_{SUPPLY}$ to the VCO module 110 which completes the system feedback loop.

In operation the VCO system 100 generates a signal based on the signals $F_{CTL}$ and $V_{SUPPLY}$ labeled OSCVCO, having a frequency controlled by $F_{CTL}$, and an amplitude controlled by the power supply voltage $V_{SUPPLY}$. The signal OSCVCO generated by the VCO module 110 is provided to application-specific circuitry, and also as an input to the amplitude detector module 120. The amplitude detector module 120 processes the OSCVCO signal and provides a signal related to the amplitude of OSCVCO labeled $V_{RECT}$. Depending upon the value of $V_{RECT}$ the threshold detect module 130 outputs one of a plurality of possible THRESHOLD INDICATOR values to the voltage supply module 140. The THRESHOLD INDICATOR signal is evaluated by the voltage supply module 140, and depending upon its value an appropriate supply voltage level ($V_{SUPPLY}$) is provided to the VCO system 100. The signal $V_{SUPPLY}$ is thus included in a closed-loop feedback path to control operation of the VCO system 100.

When the VCO system 100 is initially started, the voltage supply module 140 will set $V_{SUPPLY}$ to an initial value on its output. This initial start up voltage can be provided because a dedicated start-up indicator (such as Enable or Power-on-Reset) is detected or because the threshold detect module 120 detected a specific value of $V_{RECT}$, such as a low voltage value. The initial value of $V_{SUPPLY}$ is, by design, selected to be sufficient in magnitude, typically a maximum available voltage to ensure that the VCO 110 will start properly. However the initial magnitude of $V_{SUPPLY}$ causes the output of the VCO 110 to have an amplitude which is greater than that which is typically required to support a specific application. The OSCVCO signal from VCO 110 is fed to the amplitude detector module 120. Typically, the OSCVCO signal is rectified at the amplitude detector module to generate the signal $V_{RECT}$ that is representative of the amplitude of OSCVCO $V_{RECT}$ is provided to the threshold detect module 130, where it is compared internally to one or more known voltages. The result of this comparison determines the value of the THRESHOLD INDICATOR signal, which is provided to the input of the voltage supply module 140. The voltage supply module 140 receives the THRESHOLD INDICATOR signal, and uses its value to determine a magnitude of the supply voltage $V_{SUPPLY}$. If the VCO system 100 has only recently started the voltage supply module 140 will typically select a value for $V_{SUPPLY}$ that will cause the VCO 110 to produce the amplitude of signal OSCVCO that minimizes current drain while still producing the output power and signal to noise ratio required by the particular user's application. In this manner VCO 110 is assured of receiving a $V_{SUPPLY}$ signal which is sufficient to assure proper start-up, and after start-up $V_{SUPPLY}$ is reduced to a lesser value which will still ensure continued operation at a reduced level of current drain but with the appropriate signal to noise ratio. This completes the feedback loop of the VCO system 100.

The advantages over prior art are apparent in that prior art does not provide for adjustment of amplitude after VCO system 100 begins operation as described. The VCO system 100 ensures a sufficient magnitude of $V_{SUPPLY}$ to initiate oscillation, and then adjusts the amplitude of VCO system 100 by adjusting $V_{SUPPLY}$ to a lower level which still supports an intended application. In doing so the circuit designer can use fewer and smaller devices which provide greater tune bandwidth, higher Q, lower current drain, and lower noise.

Figure 2:
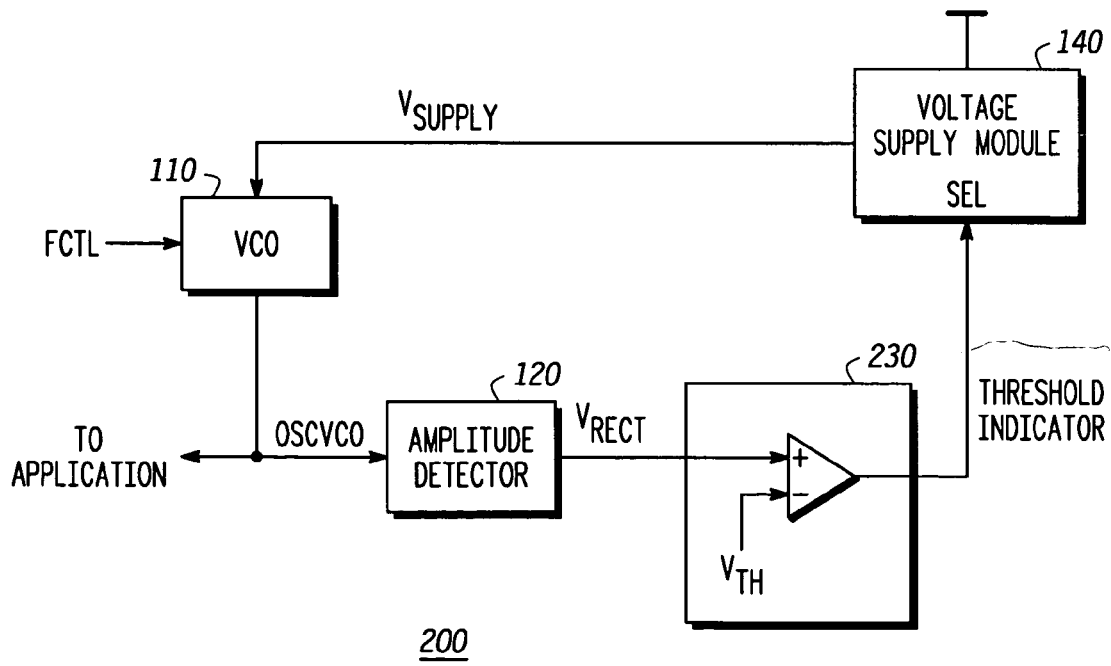
FIG. 2 is a block diagram that illustrates a specific embodiment of the system of FIG. 1.

FIG. 2 illustrates a system 200 implementing a specific threshold detect module 230. The threshold detect module 230 includes a comparator 231. A first node of the comparator 231 is connected to the signal $V_{RECT}$, which is the output provided by amplitude detector module 120. Reference voltage $V_{TH}$ is provided to the other input of comparator 231. The output of comparator 231 is the output of the threshold detect module 230, THRESHOLD INDICATOR, which is fed to the input of the voltage supply module 140.

The embodiment of FIG. 2 operates in one of two states. The first state represents the start-up phase of system 200. In this state VCO 110 receives a voltage $V_{SUPPLY}$ from voltage supply module 140 of magnitude sufficient to ensure proper start-up. As previously mentioned, this start-up voltage can be provided because a dedicated start-up indicator (such as a Power-on-Reset) is detected or because the threshold detect module 120 detects a low $V_{RECT}$ value. In this first state the voltage supply module 140 provided the large voltage because the output OSCVCO from VCO 110 is initially nonexistent or of a smaller than desired amplitude. This relatively small amplitude signal of OSCVCO is fed to the input of amplitude detector module 120 and to application specific circuitry. Amplitude detector module 120 processes the small or nonexistent OSCVCO signal and outputs a corresponding signal, $V_{RECT}$ which is then provided to the first input node of comparator 231. Comparator 231 performs a comparison, evaluating $V_{RECT}$ against the reference voltage $V_{TH}$ which is received on its other input. Because the system 200 is in start-up mode, the signal $V_{RECT}$ is less than the signal $V_{TH}$. This causes signal THRESHOLD INDICATOR, which is the output of comparator 231, to be set in a negated state. The THRESHOLD INDICATOR signal is fed to a first input of the voltage supply module 140, where it is used to select an appropriate voltage level to be output from the voltage supply module 140 to VCO 110. The fact that the THRESHOLD INDICATOR signal coming into the voltage supply module 140 is negated indicates that the output level of VCO 110 is not of sufficient amplitude to start or sustain oscillation. Therefore, the voltage supply module 140 selects a voltage with a magnitude sufficient to ensure proper startup of VCO 110 and provides this voltage as signal $V_{SUPPLY}$ to VCO 110. Additional circuitry such as power-on or start-up circuits (not illustrated) can be used to detect a start-up condition.

In the second operating state of the embodiment of FIG. 2 the VCO 110 of system 200 has achieved sufficient amplitude to sustain oscillation, as indicated by the magnitude of the signal OSCVCO. Amplitude detector 120 receives the signal OSCVCO from VCO 110 having a large amplitude for processing. The resulting output signal, $V_{RECT}$, from amplitude detector 120 is provided to the first input of comparator 231 where it is again compared against the signal $V_{TH}$ which exists on the second input node of comparator 231. Because the output signal OSCVCO from VCO 110 is now sufficiently large to sustain operation, the comparison by comparator 231 causes its output signal, THRESHOLD INDICATOR, to be asserted. THRESHOLD INDICATOR, in its asserted form, is provided to voltage supply module 140. The assertion of THRESHOLD INDICATOR at the input of voltage supply module 140 causes voltage supply module 140 to select and provide a different voltage for its output signal $V_{SUPPLY}$. This different value of $V_{SUPPLY}$ causes VCO 110 to reduce the amplitude of its output signal OSCVCO.

Figure 3:
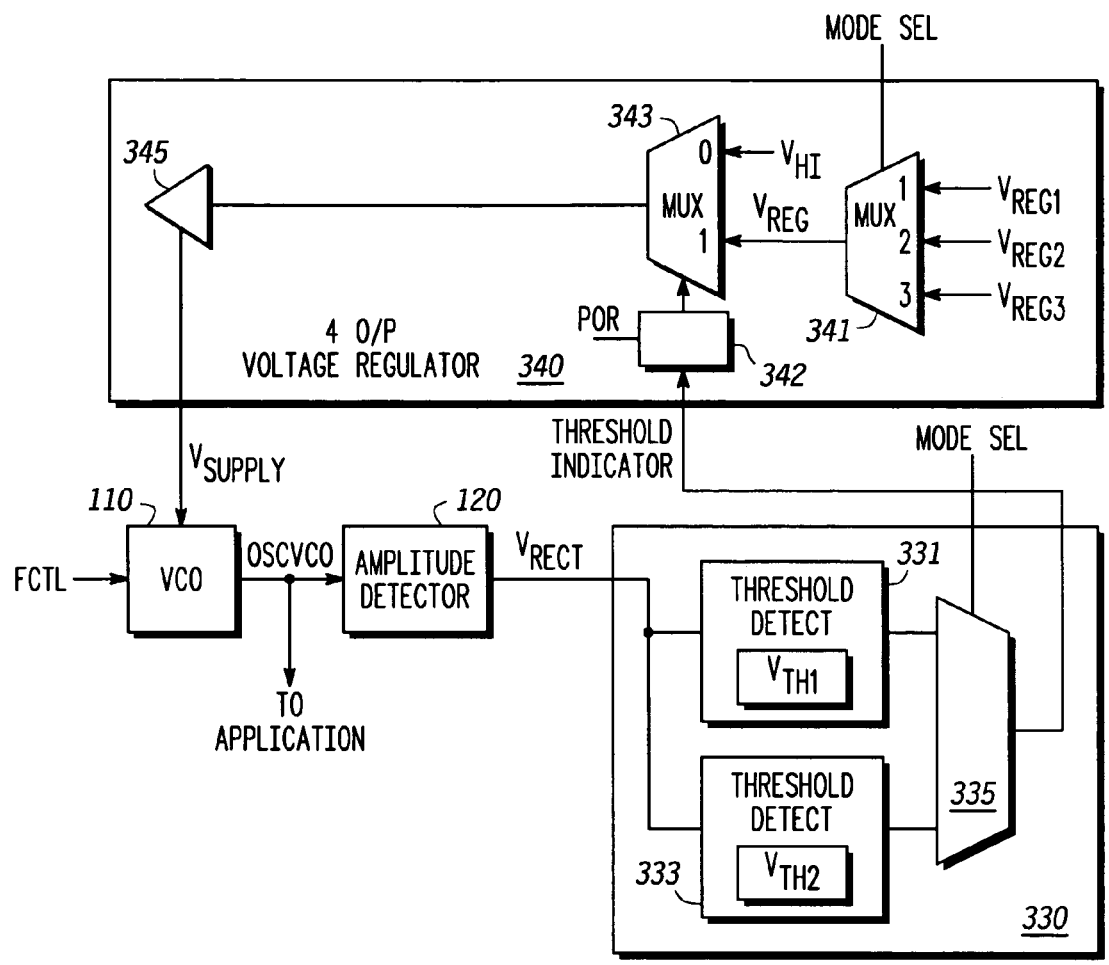
FIG. 3 is a block diagram that illustrates another more detailed embodiment of the system of FIG. 1.

Referring to FIG. 3, an embodiment of a system 300 is disclosed. In this embodiment the threshold detect module 330 contains multiple threshold detect submodules 331 and 333, and the voltage supply module 310 contains multiple voltage sources $V_{REG1}$–$V_{REG3}$. The appropriate submodule of the threshold detect module 330 is chosen by the mode selection signal MODE SEL which is typically predefined by application software or hardware. For example, one application can be supported by enabling submodule 331 while another application is supported by enabling submodule 333. This selection process is performed by the multiplexer 335. The output of the selected threshold detect submodule is the THRESHOLD INDICATOR signal of the threshold detect module 330. The MODE SEL signal is also fed to the voltage supply module 340 to determine what supply voltage value will power the VCO 110 in response to a particular THRESHOLD INDICATOR value. For example a THRESHOLD INDICATOR value of "0" can provide a different $V_{SUPPLY}$ value based on the value of MODE SEL at the voltage regulator 340. In this embodiment, the VCO 110 and amplitude detector 120 of system 300 operate as previously described in FIG. 2, and are connected via the same input and output signals.

The embodiment of FIG. 3 is capable of operating in multiple operating modes selected through the use of the MODE SEL signal. In a first operating mode, the MODE SEL signal will select threshold detect submodule 331 by passing its output through multiplexer 335 to provide the THRESHOLD INDICATOR signal. The voltage supplied to $V_{SUPPLY}$ in response to a specific THRESHOLD INDICATOR value is also based on the MODE SEL signal, which selects one of a plurality of voltage signals which may be available. Thus, the MODE SEL signal can select appropriate combinations of threshold detect submodules which are internal to the threshold detect module 330 and voltage signals which are within the voltage supply module 340.

This ability to set various operating conditions is advantageous because it allows a single circuit to perform multiple functions as required by specific or different applications. For example, the same circuit could be used in CDMA cellular telephones, which require certain signal levels, as well as cellular telephones using GSM technology which require different signal levels. Thus a single component could be marketed to multiple manufacturers, or used in multi-function cellular telephones.

Figure 4:
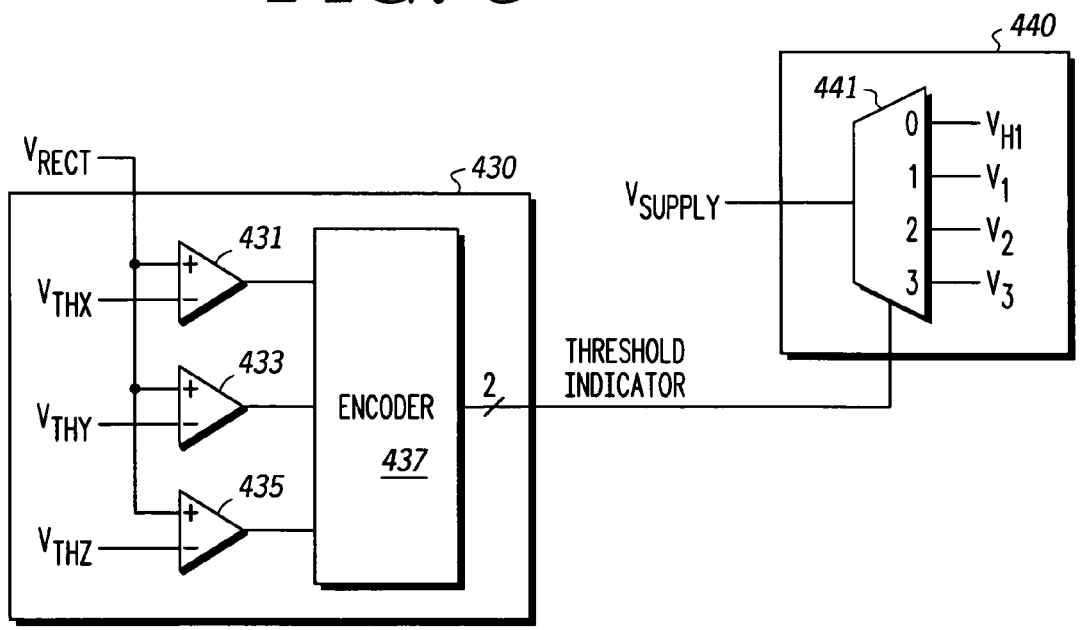
FIG. 4 is a block diagram showing a specific embodiment of the Threshold Detect and Voltage Supply Modules of FIG. 2.

FIG. 4 represents a further embodiment of the disclosure that contains multiple threshold detect outputs from the threshold detect module 430 which encode multiple possible values. In this embodiment only the threshold detect module 430 and the voltage supply module 440 are illustrated. The threshold detect module 430 receives an input the signal called $V_{RECT}$ which was described in FIG. 1. The output of the threshold detect module 430 is, in this embodiment, a two-bit signal, comprising the THRESHOLD INDICATOR signal. The THRESHOLD INDICATOR signal is provided as an input to the voltage supply module 440, where it is used to select one of a plurality of available voltage signal levels. These voltage signal levels are identified in FIG. 4 as $V_{H1}$, $V_1$, $V_2$, and $V_3$. These voltage signals are selected and routed through the analog multiplexer 441 in voltage supply module 440, and the selected voltage signal level is provided as an output from the voltage supply module 440 and identified as $V_{SUPPLY}$.

In this embodiment the threshold detect module 430 contains multiple comparators 431, 433, and 435. Each of these comparators has a different reference voltage $V_{THX}$, $V_{THY}$, and $V_{THZ}$ respectively. In this embodiment the MODE SEL signal and its associated multiplexer are not present, however in an alternate embodiment, threshold detect module 430 could be one of a plurality of submodules selected by the MODE SEL signal. The comparators 431, 433 and 435 collectively determine the value of the threshold detect signal. The reference voltages $V_{THX}$, $V_{THY}$, and $V_{THZ}$ increase in value such that as the input signal $V_{RECT}$ increases, comparators 431, 433, and 435 progressively change their output signals to the encoder 437. The various possible combinations of comparator outputs are encoded onto the output of encoder 437 and this signal, threshold detect, is then provided to the voltage supply module 440. The voltage supply module 440 uses the encoded threshold detect signal to cause an appropriate voltage output to be passed through the multiplexer 441 onto the output of the voltage supply module 440 as signal $V_{SUPPLY}$.

The embodiment of FIG. 4 allows increased granularity in the automatic adjustment of the output of the voltage supply module 440. This, in turn, allows the output of VCO 110 (as illustrated in FIG. 1) to operate at levels which may be lower than otherwise possible.

Figure 5:
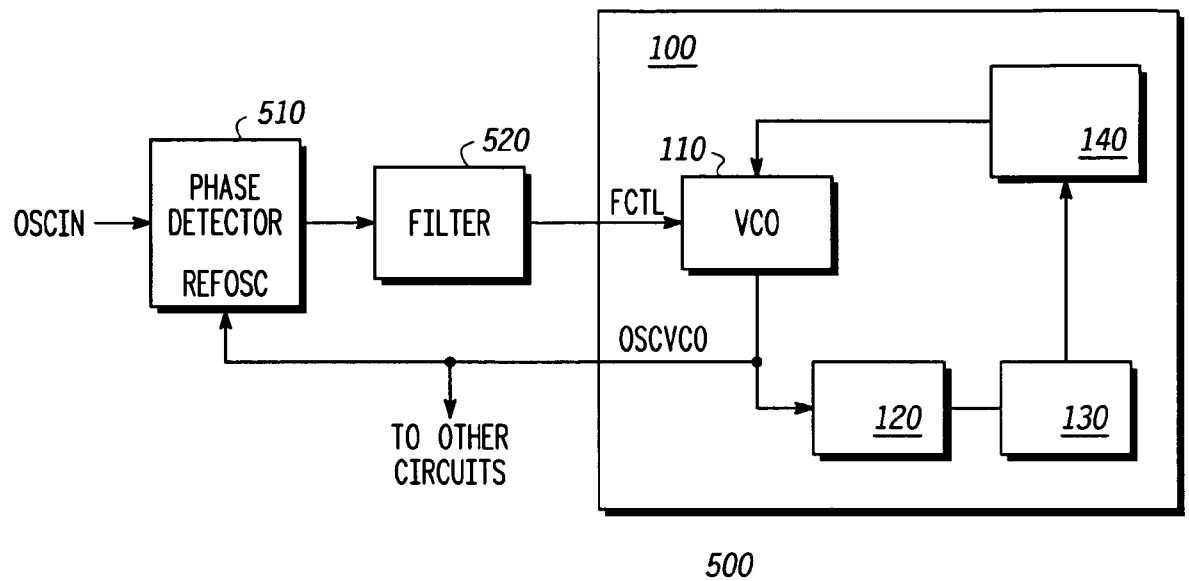
FIG. 5 illustrates the system of FIG. 1 in a phase-locked loop system.

FIG. 5 shows a block diagram representing an embodiment of the disclosure. In this instance the system 500 comprises a phased-locked-loop which is accomplished by the addition of a phase detector 510 and a filter 520 to the voltage-controlled oscillator (VCO) module system 100 described previously and shown in FIG. 1. In this embodiment a first node of phase detector 510 is connected to a signal called OSCIN which is an external signal provided by application specific circuitry. A second node of phase detector 510 is connected to the signal called OSCVCO which has been previously described. Phase detector 510 has an output that provides a signal to the input of filter 520. Filter 520 has an input which accepts the signal provided to it by phase detector 510, and a second node which provides as an output the signal called $F_{CTL}$. The signal $F_{CTL}$ is provided as an input to voltage-controlled oscillator (VCO) module system 100.

Figure 6:
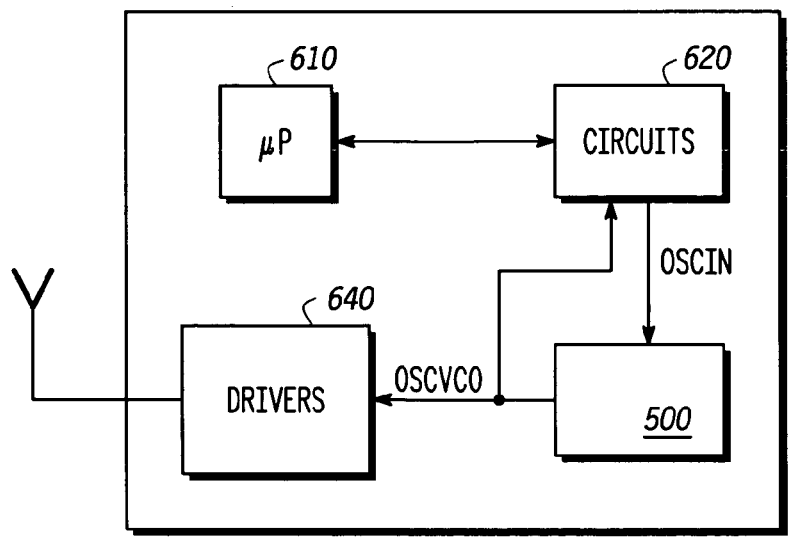
FIG. 6 is a block diagram that generally illustrates the inclusion of the phase-locked loop system of FIG. 5 in a typical application system.

FIG. 6 shows a block diagram representing another embodiment of the disclosure using the phase-locked loop system 500 in an application 600. Examples of specific systems or applications include transceivers used in wireless, wireline and cable applications which use PLLs for frequency synthesis and clock/data recovery. The various functions and components in the present application are implemented in one embodiment in a system on a chip (SOC) device that may include a data processor, or a plurality of processing devices. Such a data processor may be a microprocessor, microcontroller, microcomputer, digital signal processor, state machine, logic circuitry, and/or any device that manipulates digital information based on operational instruction, or in a predefined manner. The various functions, and systems represented by block diagrams are readily implemented by one of ordinary skill in the art using one or more of the implementation techniques listed herein. When a data processor for issuing instructions is used, the instruction may be stored in memory. Such a memory may be a single memory device or a plurality of memory devices. Such a memory device may be read-only memory device, random access memory device, magnetic tape memory, floppy disk memory, hard drive memory, external tape, and/or any device that stores digital information. Note that when the data processor implements one or more of its functions via a state machine or logic circuitry, the memory storing the corresponding instructions may be embedded within the circuitry that includes a state machine and/or logic circuitry, or it may be unnecessary because the function is performed using combinational logic. In one embodiment, the components of FIG. 1 are integrated as part of an SOC device on a single die. Likewise, all or some of the components of FIGS. 5 and 6 can be part of an SOC device. For example, the system 600 can include an SOC device comprising the components 500, 610, and 620. Driver component 540 may be part of the SOC or a separate chip.

In the preceding detailed description of the figures, reference has been made to the accompanying drawings which form a part thereof, and in which is shown by way of illustration specific embodiments in which the disclosure may be practiced. These embodiments are described in sufficient detail to enable those skilled in the art to practice the disclosure, and it is to be understood that other embodiments may be utilized and that logical, mechanical, chemical and electrical changes may be made without departing from the spirit or scope of the disclosure. To avoid detail not necessary to enable those skilled in the art to practice the disclosure, the description may omit certain information known to those skilled in the art. Furthermore, many other varied embodiments that incorporate the teachings of the disclosure may be easily constructed by those skilled in the art. Accordingly, the present disclosure is not intended to be limited to the specific form set forth herein, but on the contrary, it is intended to cover such alternatives, modifications, and equivalents, as can be reasonably included within the spirit and scope of the disclosure. For example, the present disclosure refers providing different magnitudes for the voltage supply $V_{SUPPLY}$. It will be appreciated that the varying voltages can be generated by a charge pump as part of the system 100, or be discretely applied from internal or external sources. The preceding detailed description is, therefore, not to be taken in a limiting sense, and the scope of the present disclosure is defined only by the appended claims.

What is claimed is:

1. A system comprising:
 a signal controlled oscillator comprising a signal input, a power input, and an oscillation output;
 a rectifier comprising an input coupled to the oscillation output, and a reference output to provide a rectified signal;
 a threshold detect module comprising a first input coupled to the reference output, and a threshold indicator output; and
 a voltage supply module comprising a select input coupled to the threshold indicator output, and a voltage supply output coupled to the power input of the signal controlled oscillator to supply one of a plurality of voltages based on a value received at the select input.

2. The system of claim 1, wherein the plurality of voltages are predefined and selected based upon a value received at the select input.

3. The system of claim 1, wherein the plurality of voltages are to be determined based upon a value received at the select input.

4. The system of claim 1, wherein the threshold detect module further comprises a second input coupled to receive a first mode indicator where in a first value of the first mode indicator is to identify a first specific threshold to be detected.

5. The system of claim 4, wherein the threshold detect module is to provide a first predefined value at the threshold indicator output when the rectified signal is below the first threshold value, and to provide at least a second predefined value at the threshold indicator output when the rectified signal is above the first threshold value.

6. The system of claim 5, wherein the voltage supply module further comprises a mode input coupled to receive a second mode indicator to identify a first predefined voltage reference to be provided at the voltage supply output in response to receiving the first predefined value.

7. The system of claim 6, wherein the first mode indicator and the second mode indicator are the same mode indicator.

8. The system of claim 6, wherein the first threshold value is to identify a start-up condition and the first predefined voltage reference is predetermined to start-up the signal controlled oscillator.

9. The system of claim 5, wherein the threshold detect module is to further identify a second threshold value to be detected response to receiving a second value of the first mode indicator.

10. The system of claim 9, wherein, in response to receiving the second value of the first mode indicator, the threshold detect module is to provide the first predefined value at the threshold indicator output before the specific threshold value is detected, and at least the second predefined value at the threshold indicator output after the first specific threshold is detected.

11. The system of claim 10, wherein the voltage supply module is to further provide the first predefined voltage reference in response to receiving the first predefined value when a first value of the second mode indicator is received, and to provide a second predefined voltage reference when a second value of the second mode indicator is received.

12. The system of claim 1, wherein the signal controller, rectifier, threshold detect module, and voltage supply module are formed on a common substrate.

13. The system of claim 1, wherein the system comprises an RF communication system.

14. The system of claim 1, further comprising:
 a phase detector having a first input to receive an input signal, a reference input coupled to the oscillation output, and an output coupled to the signal input.

15. The system of claim 14, further comprising:
 a filter module coupled between the output of the phase detector and the signal input of the signal controlled oscillator.

16. A method comprising:
 monitoring within a System On a Chip (SOC) device an oscillation output of a signal controlled oscillator of the SOC device to determine an operating condition of the signal controlled oscillator;
 selecting within the SOC a first supply voltage to provide the signal controlled oscillator when the operating condition is in a first state when a rectified representation of the oscillation output is below a threshold value; and
 selecting within the SOC a second supply voltage to provide the signal controlled oscillator when the operating condition is in a second state.

17. The method of claim 16, wherein the first state is indicative of a start-up condition, and the first supply voltage is larger than the second supply voltage.

18. The method of claim 16, further comprising:
 selecting within the SOC a third supply voltage to provide the signal controlled oscillator when the operating condition is in a second state.

19. The method of claim 16, wherein the operating condition is in the second state when the rectified representation of the oscillation output is above the threshold value.

20. The method of claim 19, wherein the only operating condition below the threshold value is the first state, and the only operating condition above the threshold value is the second state.

21. The method of claim 19, wherein the only operating condition below the threshold value is the first state, and operating conditions above the threshold value comprise a plurality of states.

22. The method of claim 21, further comprising:
 selecting a different supply voltage for each of the plurality of states.

23. The method of claim 16, further comprising
 monitoring a reset indicator to at least partially determine the operating condition.

24. The method of claim 23, wherein the reset indicator is a power-on-reset indicator.

25. A method comprising:
 monitoring an oscillation output of a signal controlled oscillator to determine an operating condition of the signal controlled oscillator;
 selecting a first supply voltage to provide the signal controlled oscillator when the operating condition is in a first state, wherein the operating condition is in the first state when a rectified representation of the oscillation output is below a threshold value; and
 selecting a second supply voltage to provide the signal controlled oscillator when the operating condition is in a second state, wherein the operating condition is in the second state when the rectified representation of the oscillation output is above the threshold value.

* * * * *